United States Patent
Wasshuber et al.

(10) Patent No.: US 7,339,214 B2
(45) Date of Patent: Mar. 4, 2008

(54) METHODS AND APPARATUS FOR INDUCING STRESS IN A SEMICONDUCTOR DEVICE

(75) Inventors: Christoph Wasshuber, Parker, TX (US); Keith A. Joyner, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 131 days.

(21) Appl. No.: 10/936,393

(22) Filed: Sep. 7, 2004

(65) Prior Publication Data
US 2005/0029560 A1 Feb. 10, 2005

Related U.S. Application Data

(62) Division of application No. 10/020,111, filed on Dec. 14, 2001, now Pat. No. 6,806,151.

(51) Int. Cl.
*H01L 21/336* (2006.01)

(52) U.S. Cl. ............... 257/288; 257/414; 257/418; 257/424; 257/E21.335; 257/E29.255

(58) Field of Classification Search ........... 202/285, 202/286, 287, 288; 438/192, 301, 295, 307, 438/305, 528
See application file for complete search history.

(56) References Cited

U.S. PATENT DOCUMENTS

| | | | |
|---|---|---|---|
| 4,523,213 A | 6/1985 | Konaka et al. | |
| 4,683,637 A | 8/1987 | Varker et al. | |
| 4,700,454 A | 10/1987 | Baerg et al. | |
| 5,019,882 A | 5/1991 | Solomon et al. | |
| 5,212,101 A | 5/1993 | Canham et al. | |
| 5,241,197 A | 8/1993 | Murakami et al. | |
| 5,266,510 A | 11/1993 | Lee | |
| 5,514,902 A | 5/1996 | Kawasaki et al. | |
| 5,567,629 A | 10/1996 | Kubo | |
| 5,683,934 A * | 11/1997 | Candelaria | 438/151 |
| 5,698,875 A | 12/1997 | Varmazis | |
| 5,712,173 A | 1/1998 | Liu et al. | |
| 5,863,827 A | 1/1999 | Joyner | |
| 5,882,974 A | 3/1999 | Gardner et al. | |
| 5,882,981 A | 3/1999 | Rajgopal et al. | |
| 5,909,627 A * | 6/1999 | Egloff | 438/406 |
| 6,004,871 A | 12/1999 | Kittl et al. | |
| 6,013,546 A | 1/2000 | Gardner et al. | |
| 6,153,920 A | 11/2000 | Gossmann et al. | |
| 6,214,699 B1 | 4/2001 | Joyner | |
| 6,221,724 B1 | 4/2001 | Yu et al. | |
| 6,228,694 B1 * | 5/2001 | Doyle et al. | 438/199 |
| 6,261,964 B1 | 7/2001 | Wu et al. | |
| 6,284,626 B1 | 9/2001 | Kim | |
| 6,310,367 B1 * | 10/2001 | Yagishita et al. | 257/190 |
| 6,426,279 B1 | 7/2002 | Huster et al. | |

(Continued)

*Primary Examiner*—Sue A. Purvis
*Assistant Examiner*—Fazli Erdem
(74) *Attorney, Agent, or Firm*—W. James Brady, III; Frederick J. Telecky, Jr.

(57) ABSTRACT

Methods and apparatus are disclosed for selectively inducing stress in a semiconductor device, wherein a first region of a substrate is implanted so as to induce stress in a second region. An electrical device is formed at least partially in the second region, wherein the induced stress therein may improve one or more operational characteristics of the device, such as channel region carrier mobility.

13 Claims, 12 Drawing Sheets

U.S. PATENT DOCUMENTS 6,432,798 B1    8/2002   Liu et al.
6,756,285 B1 *  6/2004   Moriceau et al. ........... 438/455

2002/0063294 A1   5/2002  Brown et al.

* cited by examiner

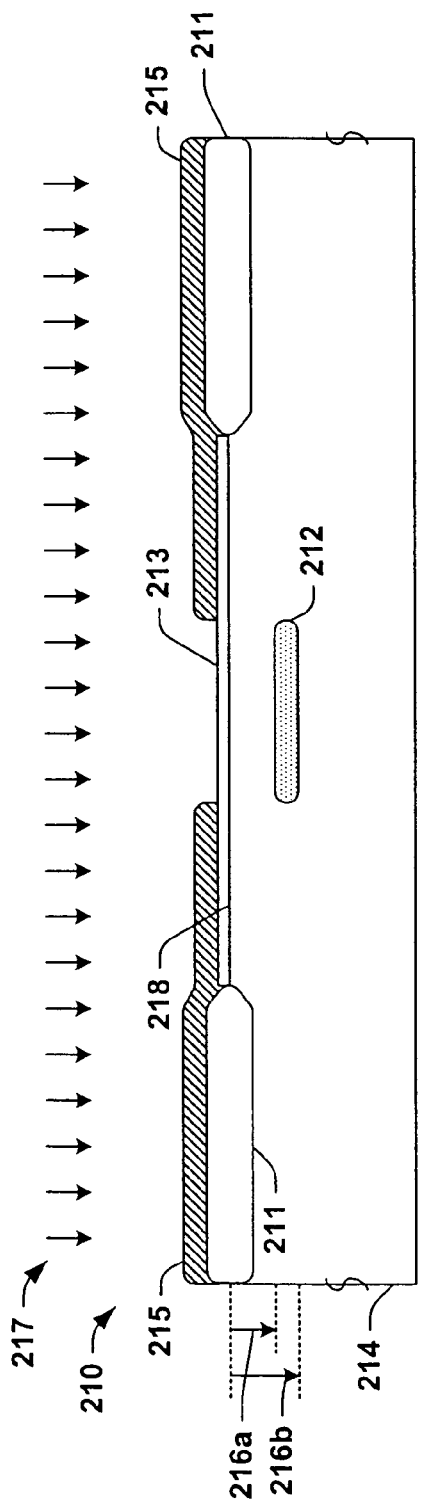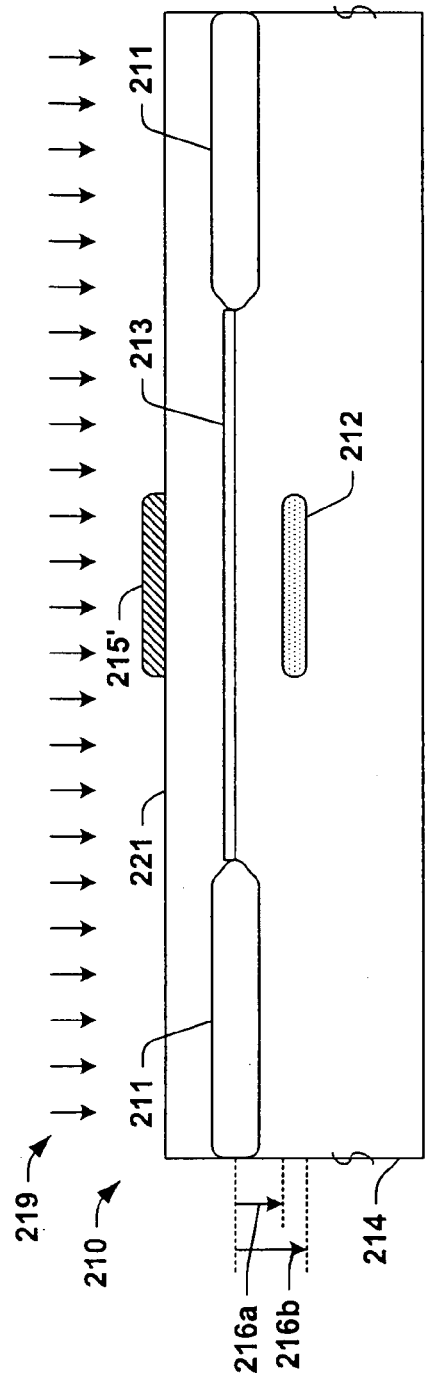

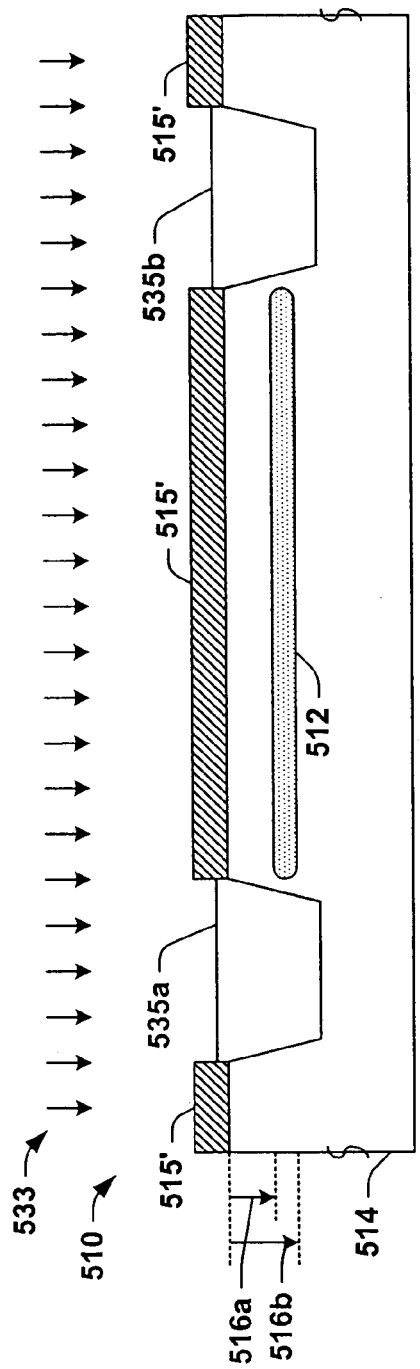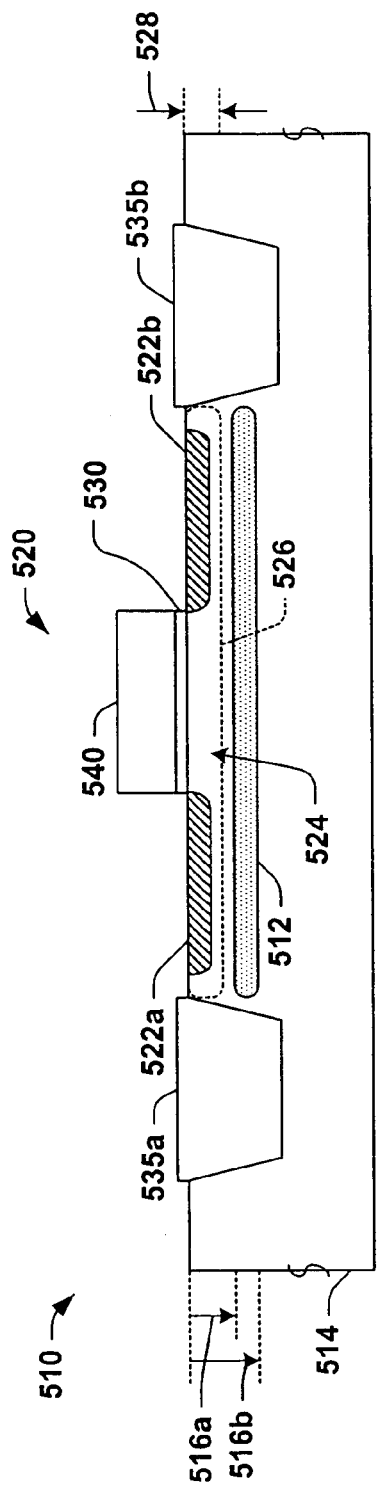

METHODS AND APPARATUS FOR INDUCING STRESS IN A SEMICONDUCTOR DEVICE

This application is a divisional of application Ser. No. 10/020,111, filed Dec. 14, 2001 now U.S. Pat. No. 6,806,151.

FIELD OF INVENTION

The present invention relates generally to semiconductor devices and more particularly to methods and apparatus for fabricating semiconductor devices using implantation to induce stress in an electrical device.

BACKGROUND OF THE INVENTION

Many conventional semiconductor devices include metal-oxide-semiconductor field-effect transistor (MOSFET) and other transistor devices to perform a variety of functions, such as switching, amplification, and the like. As required switching speeds increase and as operating voltages levels decrease in semiconductor products, the performance of transistors within such products needs to be correspondingly improved. For instance, switching speed requirements of MOSFETs and other transistors continue to increase in order to facilitate faster and improved product performance. Moreover, as such devices increasingly find application within wireless communications systems, portable computers, and other low-power, low-voltage devices, MOSFETs and other devices increasingly must be adapted to operate using less power and at lower voltages.

The carrier mobility in a MOSFET device can have a significant impact on power consumption and switching performance. The carrier mobility is a measure of the average speed of a carrier (e.g., holes or electrons) in a given semiconductor, given by the average drift velocity of the carrier per unit electric field. Thus, improved carrier mobility can improve the switching speed of a MOSFET transistor. Moreover, improving the carrier mobility in the device can allow operation at lower voltages. This may be accomplished, in addition, by reducing the channel length and gate dielectric thickness in order to improve current drive and switching performance. However, reducing the gate dielectric thickness results in an increase in gate tunneling current, which in turn degrades the performance of the device by increasing off state leakage. In addition, decreasing gate length generally requires more advanced and expensive lithography technology.

Other attempts at improving carrier mobility in silicon MOSFET devices have included depositing silicon/germanium alloy layers between upper and lower silicon layers under compressive stress, in order to enhance hole carrier mobility in a channel region. However, such buried silicon/germanium channel layer devices have shortcomings, including increased alloy scattering in the channel region that degrades electron mobility, a lack of favorable conduction band offset which mitigates the enhancement of electron mobility and the need for large germanium concentrations to produce strain and thus enhanced mobility. Furthermore, such additional alloy layers and silicon layers are costly, adding further processing steps to the device manufacturing procedure. Thus, there is a need for methods and apparatus by which the carrier mobility and other electrical operational properties of MOSFET and other transistor devices may be improved so as to facilitate improved switching speed and low-power, low-voltage operation, without significantly adding to the cost or complexity of the manufacturing process.

SUMMARY OF THE INVENTION

The following presents a simplified summary in order to provide a basic understanding of one or more aspects of the invention. This summary is not an extensive overview of the invention. It is intended neither to identify key or critical elements of the invention nor to delineate the scope thereof. Rather, the primary purpose of the summary is to present some concepts of the invention in a simplified form as a prelude to the more detailed description that is presented later. The invention relates to semiconductor device fabrication, wherein selective implantation of one or more species are used to induce stress in electrical devices within a semiconductor chip. The induced stress may be used to modify the electrical behavior of the devices, such as by improving carrier mobility, silicidation, diffusion behavior, or other performance characteristics or fabrication processes.

The invention generally provides methods and apparatus for selectively inducing stress in a semiconductor device, wherein a first region of a substrate is implanted so as to induce stress in a second region. An electrical device is formed at least partially in the second region, wherein the induced stress therein may be advantageously employed to improve performance characteristics in a controlled fashion. In this manner, the invention may be employed, for instance, to induce stress (e.g., tensile or compressive) selectively in a channel region (e.g., or a portion thereof) in a MOSFET device, in order to improve carrier mobility. Furthermore, the particular species chosen for implantation in the first region may be selected according to the type of device in which stress is to be induced (e.g., PMOS or NMOS).

According to one aspect of the present invention, a method is provided for fabricating semiconductor devices. The method involves selectively implanting a first region in a substrate so as to induce stress in a second region in the substrate, and forming an electrical device in the substrate, at least a portion of the electrical device being in the second region. The first region may, but need not, be formed so as to underlie the second region, and may be implanted by forming a mask over a first portion of a top of the substrate in order to leave a second portion thereof exposed, and performing an ion implantation using the mask so as to implant the first region in the substrate below the exposed second portion. In order to conserve on processing steps, the implantation may be done using masks already used for other operations. For example, the implantation may be done using a dopant mask, also employed to selectively dope the substrate (e.g., to form source/drain regions and/or depletion type channel regions, etc.) using at least one of diffusion and implantation during formation of a MOSFET type electrical device. As another example, the mask used for implantation of the first region may also function as an etch mask used to form an isolation trench or other ancillary structures.

Various implantation species may be used for implanting the first region. For example, in one implementation of the method, the implantation may employ carbon, germanium, and/or oxygen using the mask to implant the first region in the substrate below the exposed second portion. Carbon may be used, for example, where it is desired to create a tensile stress in the first region. This stress, in turn, induces a stress (e.g., tensile or compressive) in the second region, depending on the configuration of the first and second regions in the substrate. Conversely, implantation of germanium or oxygen in the first region may be done to create a compressive stress therein. The induced stress in the second region may thus be engineered to advantageously affect the electrical operation of the device. For instance, compressive induced stress in the second region may be used to increase hole mobility in a PMOS channel region, whereas tensile induced stress may be employed to increase electron mobility in an NMOS type device.

Another aspect of the invention provides a semiconductor device, having first and second regions in a substrate. The first region is implanted so as to induce stress in the second region, and an electrical device or a portion thereof is provided in the second region. The first region may be located beneath at least a portion of the second region, or be near the second region in order to facilitate the induced stress effect therein. The electrical device may be, for example, a transistor with a source/drain region or a channel region formed within the second region, and the first region may be implanted with carbon, germanium, and/or oxygen so as to induce stress in the second region. Yet another aspect of the invention provides a method of improving carrier mobility in a channel region of a MOSFET device, which involves implanting a first region in a substrate so as to induce stress in a second region in the substrate, and forming at least a portion of the channel in the second region of the substrate.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIGS. 7-10 are side elevation views in section illustrating a portion of another exemplary implementation of structures and methodologies in accordance with the invention, wherein a region underlying a MOSFET channel region in a semiconductor substrate is implanted in order to induce stress therein;

FIGS. 19-22 are side elevation views in section illustrating a portion of another implementation of the invention, wherein a region underlying an electrical device in a semiconductor substrate is implanted in order to induce stress in a MOSFET device.

DETAILED DESCRIPTION OF THE INVENTION

Figure 1:
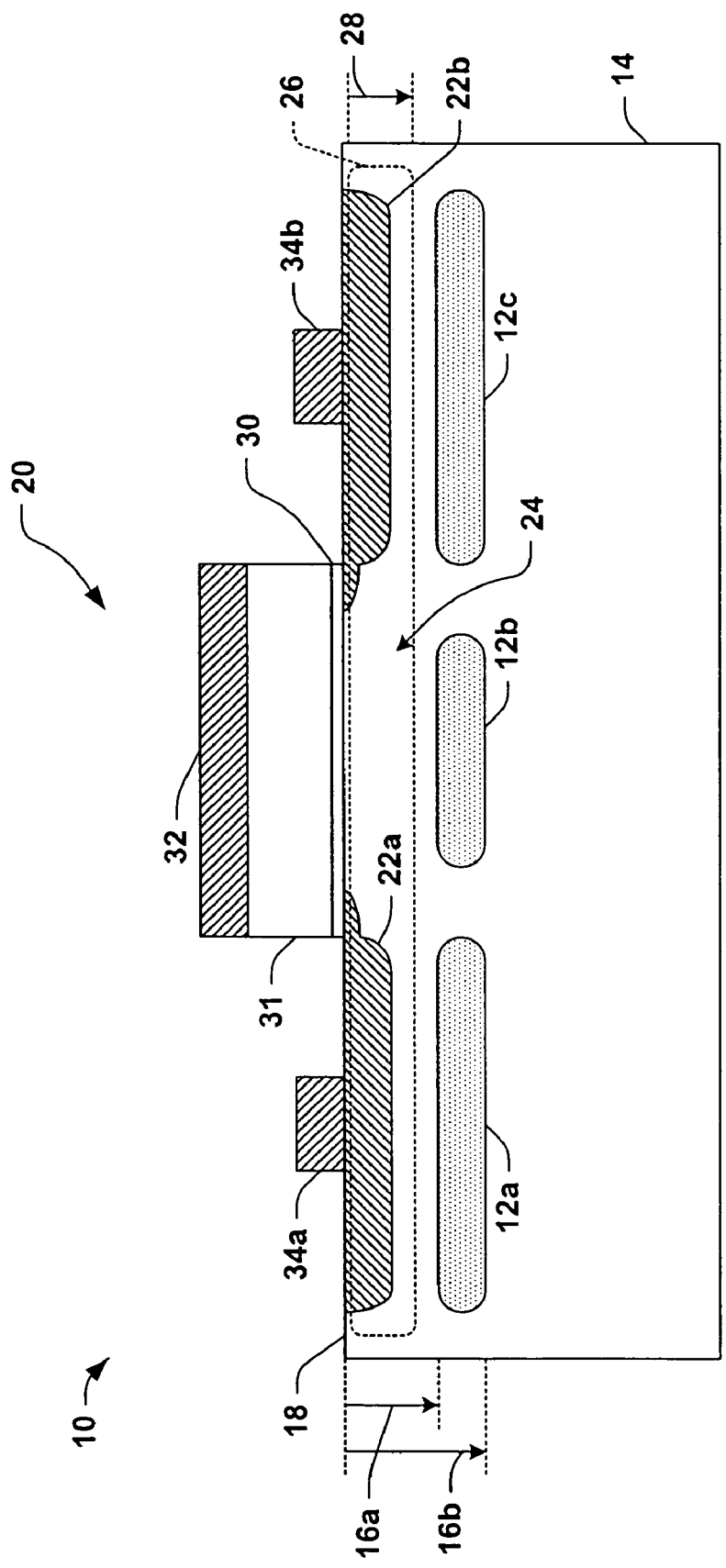
FIG. 1 is a side elevation view in section illustrating a portion of an exemplary semiconductor device in accordance with the present invention.

The present invention will now be described with reference to the attached drawings, wherein like reference numerals are used to refer to like elements throughout. The invention relates to methods and structures for influencing stress in an electrical region of a semiconductor device, by which one or more operational performance characteristics of the device may be improved. In the illustrated examples which follow, several implementations of the invention are shown and described which operate to improve carrier mobility in MOSFET type transistors. However, it will be appreciated that the various aspects of the invention may be employed to improve or modify other characteristics of semiconductor devices apart from carrier mobility, as well as in association with devices other than MOSFET transistors. For example, alternatively or in combination with affecting carrier mobility, the present invention may be advantageously employed in improving diffusion behavior, silicidation, and other operational characteristics or in advantageously influencing manufacturability or reliability of semiconductor devices.

Referring initially to FIG. 1, an exemplary semiconductor device 10 is illustrated in section in accordance with the present invention, comprising first regions 12a, 12b, and 12c (hereinafter collectively referred to as 12) locally implanted in a silicon or other semiconductor substrate 14 between a first depth 16a and a second depth 16b below an upper surface 18 of the substrate 14. A MOSFET type transistor device 20 is formed in the semiconductor device 10, with source/drain regions 22a and 22b and a channel region 24 formed within a second region 26 of the substrate 14, wherein the second region extends generally from the upper surface 18 to a depth 28 in the substrate 14, and wherein the depth 28 is less than the depths 16a and 16b associated with the first regions 12. It is noted at this point that the second region 26 may, but need not, extend upwardly to the top surface 18 of the substrate 14. The transistor 20 further comprises a gate oxide structure 30 formed over the channel region 24, as well as a poly gate structure 31 and a conductive gate contact structure 32 overlying the poly gate 31, and source/drain contact structures 34a and 34b overlying portions of the source/drain regions 22a and 22b, respectively. The device 10 may further include other overlying structures, such as one or more insulation layers and connection metal layers (not shown), wherein it is noted that the relative sizes of the structures shown in FIG. 1 are not necessarily to scale.

The first regions 12 are thus implanted near to, but not substantially within the second region 26. In this regard, it is noted that the implanted species concentration within the first regions 12 may comprise a distribution, wherein non-uniform implantation concentration within the regions 12 is contemplated as falling within the scope of the present invention. Furthermore, it will be appreciated that the implantation of the first regions 12 may, but need not impart a non-zero amount of implanted species within the second region 26. The first regions 12, moreover, are implanted so as to induce stress in the second region 26 so as to advantageously impact one or more performance characteristics or other features of the electrical MOSFET device 20 through induced stress in the second region 26. For instance, in the device 10 of FIG. 1, the first region 12a underlies the source/drain region 22a in the second region 26, the first region 12b underlies the MOSFET channel 24 in the second region 26, and the first region 12c underlies the source/drain region 22b in the second region 26. The first regions 12 may be implanted using any appropriate ion implantation apparatus (not shown) so as to induce stress in the second region 26 or portions thereof, without implanting particles in the second region 26. For instance, carbon, germanium, and/or oxygen may be implanted in the first regions 26 so as to induce stress in the second region 26.

Due to the impact of such implantation on the lattice structure of the silicon in the first regions 12, volumetric expansion or contraction can be achieved by controlling the dosage of the implantation to achieve any desired concentration of implanted species within the silicon. Thus, where germanium or oxygen is implanted in the regions 12, for example, a volumetric expansion results in the regions 12 creating a compressive stress therein, which in turn induce compressive or tensile stress in one or more portions in the second region 26. Conversely, implantation of one or more of the first regions 12 with carbon, for example, causes a volumetric contraction and a corresponding tensile stress therein, which may be used to induce a compressive stress in the second region 26. As a result of such induced stress in the second region 26, performance or behavior of electrical devices therein (e.g., the source/drain regions 22a, 22b and/or the channel region 24) can be modified. For instance, compressive induced stress in the second region 26 may be used to increase hole mobility in a PMOS channel region 24 of the MOSFET transistor 20, whereas tensile induced stress may be employed to increase electron mobility in an NMOS type device 20.

It is noted at this point that based on the relative locations of the first and second regions, that implantation created compressive stress in the first regions 12 may be used to selectively induce tensile stress in the second region 26, and further that implantation created tensile stress in the first regions 12 may be used to selectively induce compressive stress in the second region 26. Thus it will be appreciated that many different configurations of first and second regions may be employed within the scope of the invention so as to effectuate any desired induced stress in the second region 26 by selective localized implantation of appropriate species in the first regions 12. Thus, the invention is not limited by the first and second regions 12 and 26, respectively, as illustrated in FIG. 1, and that many other relative locations, sizes, and/or orientations of first and second regions are contemplated as falling within the scope of the present invention and the appended claims, several of which are illustrated and described further hereinafter with respect to FIGS. 3-22. For instance, while the device 10 in FIG. 1 illustrates the implanted first regions 12 generally underlying the second region 26 and the electrical devices (e.g., the source/drain regions therein 22 and the channel region 24), that the first regions 12 may be laterally disposed with respect thereto without completely or partially underlying the region 26. The invention thus comprises implantation of any first region in the substrate 14 so as to induce stress in a second region thereof.

Another aspect of the invention provides methods for fabricating semiconductor devices. The methods comprise selective implantation of a first region in a substrate so as to induce stress in a second region in the substrate, and the formation of an electrical device in the substrate, at least a portion of which is in the second region. The first region may, but need not be formed so as to underlie the second region or a portion thereof, such as through forming a mask over a first portion of a top of the substrate in order to leave a second portion thereof exposed, and performing an ion implantation using the mask so as to implant the first region in the substrate below the exposed second portion. In this regard, the implantation may be done using masks already used for other operations, so as to conserve on processing steps. For example, the implantation may be done using a dopant mask, also employed to selectively dope the substrate (e.g., to form source/drain regions and/or depletion type channel regions, etc.) using at least one of diffusion and implantation during formation of a MOSFET type electrical device. As another example, the mask used for implantation of the first region may also function as an etch mask used to form an isolation trench.

Figure 2:
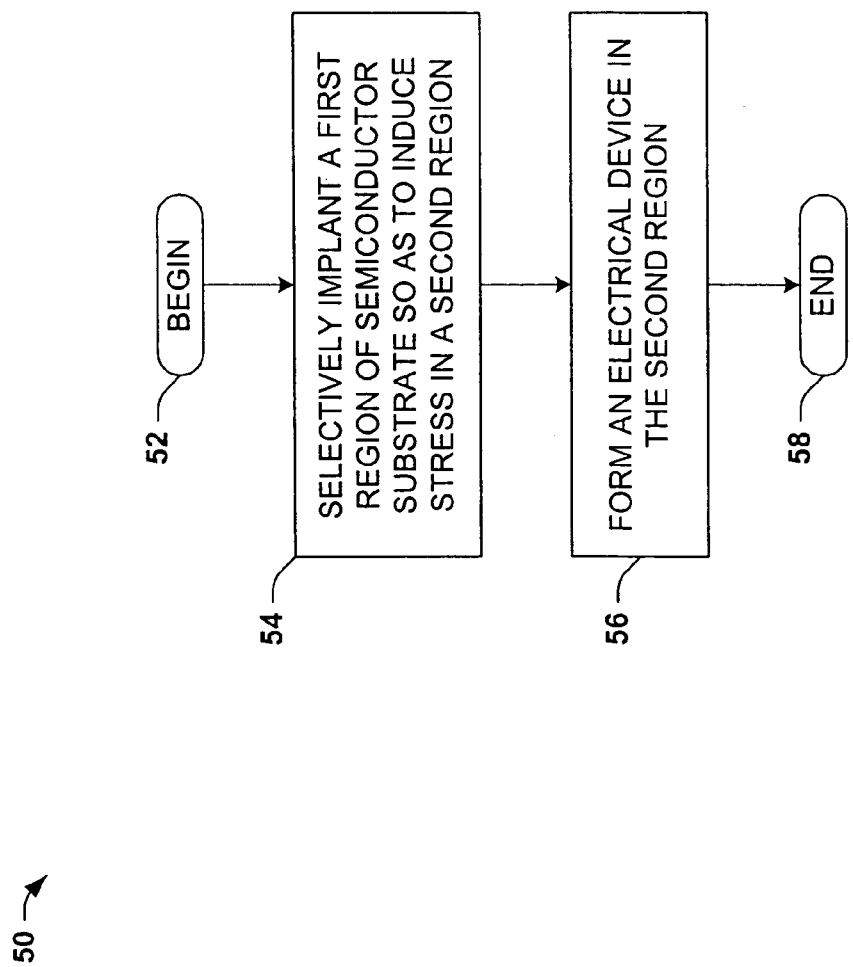
FIG. 2 is a flow diagram illustrating an exemplary method of fabricating a semiconductor device in accordance with another aspect of the invention.

In FIG. 2, an exemplary method 50 is illustrated in accordance with the present invention. Although the method 50 is illustrated and described hereinafter as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation of structures illustrated and described herein as well as in association with other structures not illustrated.

Beginning at 52, the method 50 comprises selectively implanting a first region in a substrate at 54 so as to induce stress in a second region in the substrate, and forming an electrical device in the substrate at 56, wherein at least a portion of the electrical device is in the second region, before the method 50 ends at 58. The selective implantation at 54 may comprise implanting the first region beneath at least a portion of the second region, and may advantageously employ masks used for other processing steps in fabricating the device. As discussed above, the implantation may employ any suitable species, energy levels, and concentrations so as to induce the desired stress in the second region, for example, such as by implanting carbon, germanium, oxygen, or other species.

Figure 3:
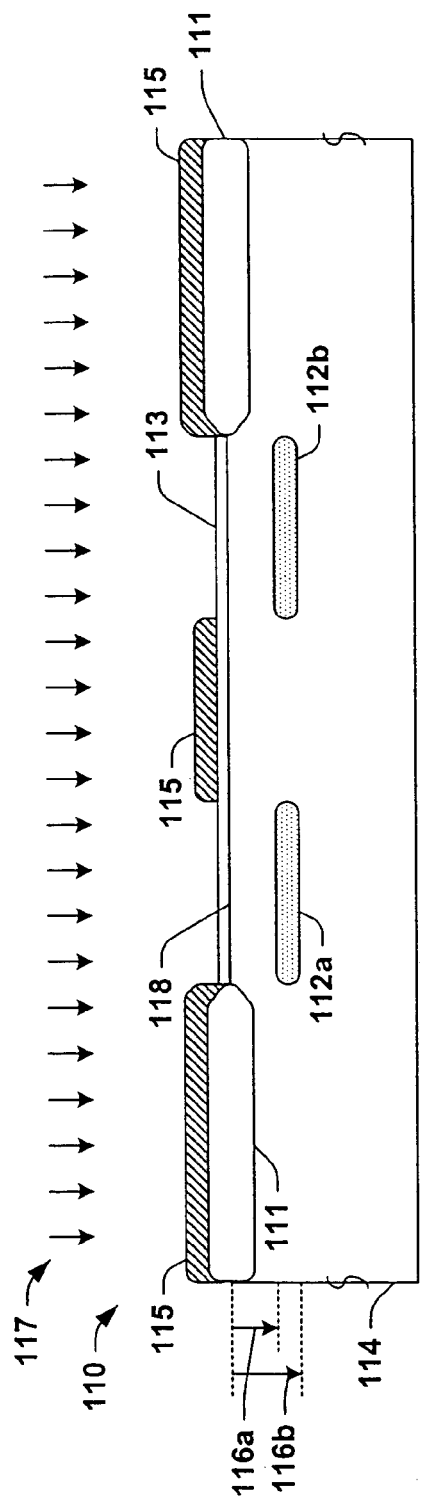
FIGS. 3-6 are side elevation views in section illustrating a portion of an exemplary implementation of structures and methodologies in accordance with the invention, wherein one or more regions underlying MOSFET source/drain regions in a semiconductor substrate are implanted in order to induce stress therein.
Figure 4:
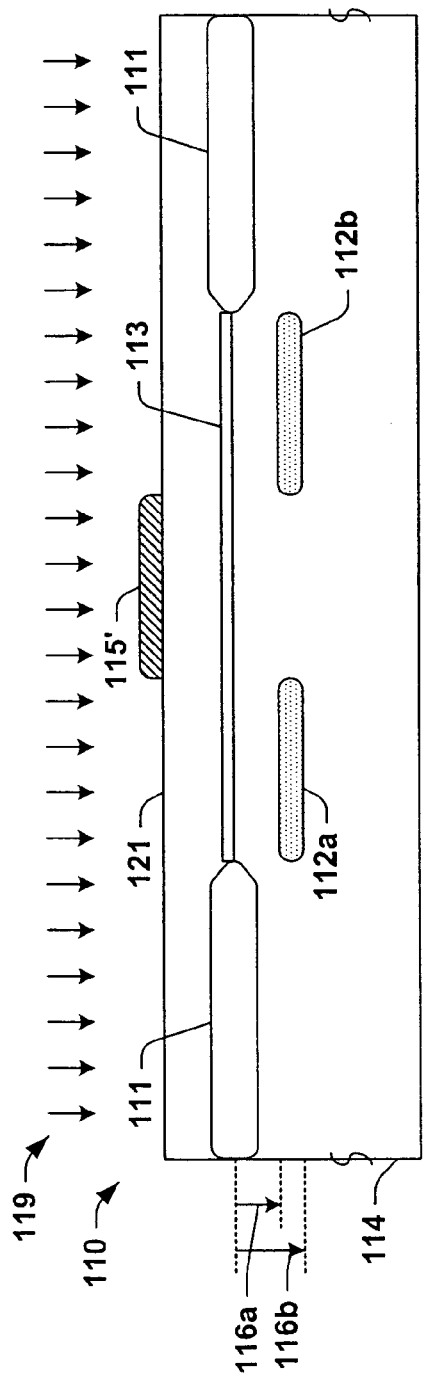

Referring now to FIGS. 3-6, one implementation of the invention is illustrated in which one or more regions underlying MOSFET source/drain regions in a semiconductor substrate are implanted in order to induce stress therein. A semiconductor device 110 is illustrated in FIG. 3 comprising a substrate 114, such as silicon, having field oxide portions 111 formed (e.g. using local oxidation of silicon or LOCOS processing) laterally on either side of an active area for a prospective MOSFET transistor device (not shown), and a gate dielectric layer 113, such as SiO2 of any appropriate thickness, grown at the top surface 118 of the substrate 114 using appropriate thermal oxidation processing (not shown). A stress implantation mask 115 is formed on the top surface 118 of the substrate 114 overlying the field oxide portions 111 as well as a portion of the gate oxide layer 113, so as to expose regions of the gate oxide layer 113 generally overlying prospective source/drain regions in the substrate 114. First regions 112a and 112b are implanted in the substrate 114 through the exposed portions of the gate oxide layer 113 using the mask 115 via an implantation process 117 between a first depth 116a and a second depth 116b below the upper surface 118 of the substrate 114, for example, using one of germanium, oxygen, and carbon as an implantation species. Although the implantation process 117 is illustrated as being performed after formation of the gate oxide layer 113, it will be appreciated that the first regions 112 may alternatively be implanted in the substrate 114 prior to forming the gate oxide layer 113 within the scope of the present invention.

Figure 5:
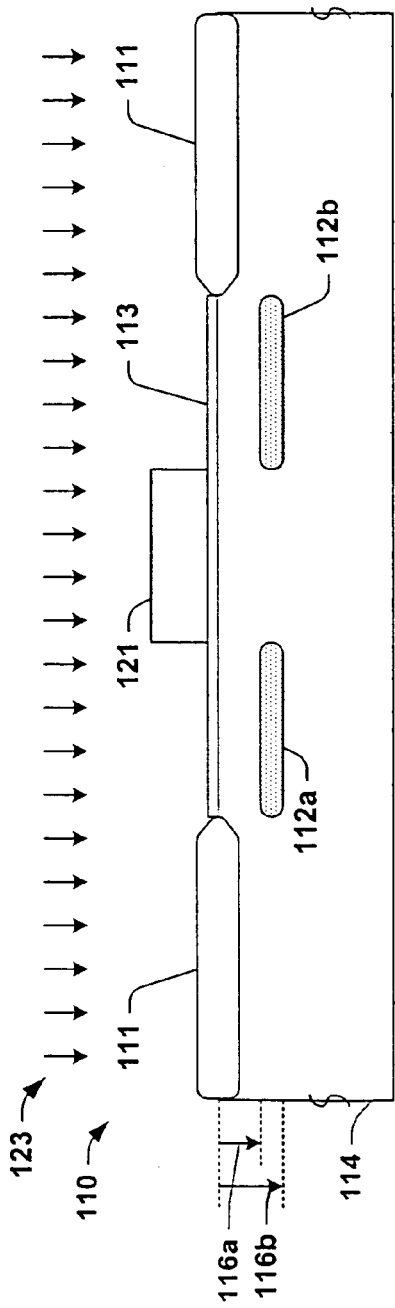
Figure 6:
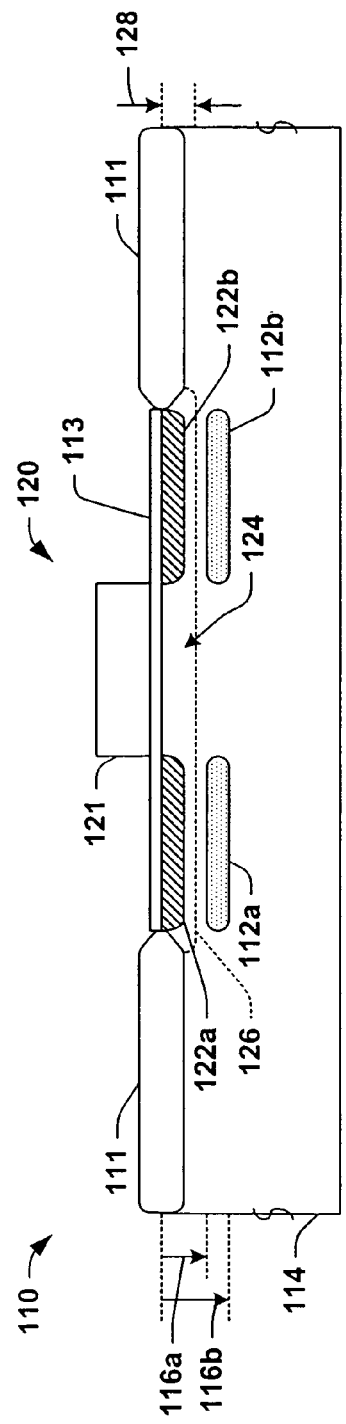

The implantation process 117 provides selective, localized implantation in the first regions 112a and 112b by virtue of the openings in the mask 115. The stress implantation mask 115 is then removed and a polysilicon layer 121 is deposited on the device 110, as further illustrated in FIG. 4. A second mask 115' is then formed on the polysilicon layer 121, generally overlying a prospective gate region, and a selective etch process 119 is employed to remove the exposed portions of the polysilicon 121. As illustrated in FIGS. 5 and 6, a source/drain implantation process 123 (e.g., such as a lightly doped drain (LDD) implantation using phosphorus or boron or other desired dopants) is then employed to form first and second source/drain regions 122a and 122b, respectively, defining a channel region 124 therebetween, in a second region 126 in the substrate 114. The second region 126 extends downwardly from the substrate top surface 118 to a second region depth 128, wherein the depth 128 is less than the first and second depths 116a and 116b. Thereafter, further processing may be performed to refine the source/drain regions 122, such as sidewall spacer formation, further implantation of the source drain regions 122, silicide formation on the upper surfaces of the gate structure 121 and the source/drain regions 122, and creation of conductive pads or contact structures (not shown) overlying portions of the source/drain regions 122a and 122b, respectively, and the gate structure 121 (not shown), by which a MOSFET type transistor device 120 is created. The device 110 may include further overlying structures, such as one or more insulation layers and connection metal layers (not shown), wherein it is noted that the relative sizes of the structures shown in FIGS. 3-6 are not necessarily to scale.

It is noted in FIG. 6 that the first regions 112a and 112b are implanted proximate or near to the second region 126, and in particular, to the source/drain and channel regions 122 and 124, respectively. The implantation into the first regions 112 via the process 117 (FIG. 3), moreover, creates compressive or tensile stress in the regions 112 (e.g., depending upon the implantation species employed) so as to induce stress in the second region 126. The resulting induced stress may be used to advantageously impact one or more performance characteristics or other features of the electrical MOSFET device 120. The first implanted region 112a underlies the source/drain region 122a in the second region 126 and the first region 112b underlies the source/drain region 122b in the second region 126. The first regions 112a and 112b may be implanted using any appropriate ion implantation apparatus (not shown) so as to induce stress in the second region 126 or portions thereof, without implanting a substantial amount of particles in the second region 126. For instance, carbon, germanium, and/or oxygen may be implanted in the first regions 112 so as to induce stress in the second region 126, and in particular, to induce stress in one or more of the source/drain regions 122 and/or the channel region 124 in a controlled fashion.

The implantation of the regions 112a and 112b impacts the lattice structure of the silicon in the first regions 112 of the substrate 114, resulting in volumetric expansion or contraction thereof according to the dosage, energy, and species type of the implantation process 117 to achieve any desired concentration of implanted species within the silicon in the regions 112, including non-uniform (e.g., Gaussian distribution or other) concentrations thereof. For instance, germanium or oxygen may be implanted in the regions 112 to affect a volumetric expansion and a corresponding compressive stress therein, which induces tensile stress in one or more portions in the second region 126. Conversely, implantation of one or more of the first regions 112 with carbon causes a volumetric contraction and a corresponding tensile stress in the first regions 112, which may be used to induce a compressive stress in the second region 126.

Thus, in the device 110 of FIG. 6, it is noted that where carbon is implanted in the regions 112 underlying the source/drain regions 122, the regions 112 will have a tensile stress created therein, which may induce compressive stress in the overlying source/drain regions 122. In addition, depending on the relative sizes and orientations of the first regions 112 and the channel region 124, the tensile stress in the regions 112 may induce a compressive stress in the channel region 124. As a result of such induced stress in the second region 126, performance or behavior of electrical devices therein (e.g., the source/drain regions 122a, 122b and/or the channel region 124) can thus be modified. For instance, compressive induced stress in the second region 126 may be used to increase hole mobility in a PMOS channel region 124 of the MOSFET transistor 120, whereas tensile induced stress may be employed to increase electron mobility in an NMOS type device 120.

It is noted that the invention is not limited to first and second regions (e.g., regions 112 and 126) at different depths and that the first and second regions may be at the same depths relative to the substrate top surface 118, or at overlapping depths, wherein lateral spacing therebetween may be provided. In this regard, any such relative locations may be implemented in accordance with the invention, by which implantation into the first region(s) induces stress in the second region(s). It is further noted in the implementation of FIGS. 3-6, that the mask 115' (FIG. 4) may alternatively be used for implantation of the regions 112 as well as for the formation of the polysilicon gate structure 121 (FIGS. 5 and 6). Thus, it is seen that the selective implantation of the first regions 112 can be accomplished using existing (e.g., dual purpose) masks, so as to minimally impact the fabrication process, while providing improvement in one or more electrical performance characteristics of the device 110.

Referring now to FIGS. 7-10, another exemplary implementation of the invention is illustrated, wherein a first region underlying a MOSFET channel region is implanted in order to induce stress in the channel. A semiconductor device 210 is illustrated in FIG. 7 comprising a substrate 214, having field oxide portions 211 formed laterally on either side of an active area for a prospective MOSFET transistor device (not shown), and a gate oxide layer 213 grown at a top surface 218 of the substrate 214. A stress implantation mask 215 is formed on the top surface 218 of the substrate 214 overlying the field oxide 211 as well as a portion of the gate oxide layer 213, so as to expose regions of the gate oxide 213 generally overlying a prospective channel region in the substrate 214. First regions 212a and 212b are implanted in the substrate 214 through the exposed portions of the gate oxide layer 213 using the mask 215 via an implantation process 217 between a first depth 216a and a second depth 216b below the upper surface 218 of the substrate 214, for example, using one of germanium, oxygen, and carbon as an implantation species. As with the device 110 of FIGS. 3-6, the implantation process 217 of FIG. 7 for forming the first regions 212 may alternatively be performed prior to forming the gate oxide layer 213.

Figure 9:
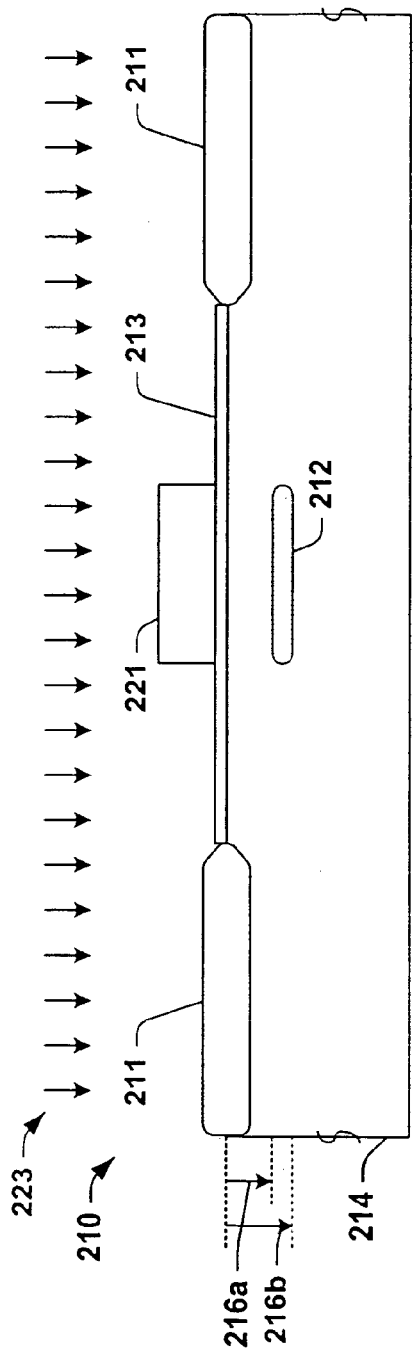
Figure 10:
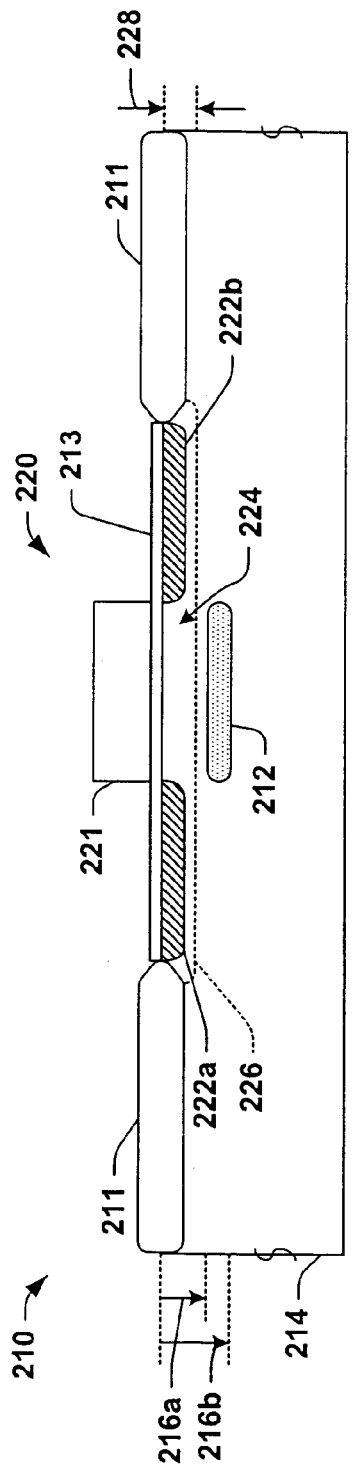

Referring also to FIG. 8, the stress implantation mask 115 is then removed and a polysilicon layer 221 is deposited on the device 210. A second mask 215' is formed on the polysilicon layer 221, generally overlying a prospective gate or channel region, and a selective etch process 219 is employed to remove the exposed portions of the polysilicon 221. In FIGS. 9 and 10, a source/drain implantation process 223 is employed to form first and second source/drain regions 222a and 222b, respectively, defining a channel region 224 therebetween, in a second region 226 in the substrate 214. The second region 226 extends downwardly from the substrate top surface 218 to a second region depth 228 less than the first and second depths 216a and 216b. Thereafter, further processing may be performed to refine the source/drain regions 222, and conductive contact structures (not shown) may be formed overlying portions of the source/drain regions 222a and 222b, respectively, and the remaining polysilicon gate structure 221 (not shown), by which a MOSFET type transistor device 220 is created. The device 210 may include further overlying structures, such as insulation and metal layers metal layers, wherein the relative sizes of the structures illustrated in FIGS. 7-10 are not necessarily to scale.

In this manner, the MOSFET type transistor device 220 is formed in the device 210, which may be PMOS or NMOS, depending upon the initial doping of the substrate 214 and the dopant implantation process 223 of FIG. 9. The implantation into the first region 212 via the process 217 (FIG. 7) creates compressive or tensile stress in the region 212 (e.g., depending upon the implantation species employed therein) so as to induce stress in the second region 226, which in turn can be used to change one or more performance characteristics or other features of the electrical MOSFET device 220.

In this implementation, the first implanted region 212 underlies the channel region 224 in the second region 226. The first region 212 may be implanted using any appropriate ion implantation apparatus (not shown) so as to induce stress in the second region 226 or portions thereof (e.g., the channel region 224), without implanting a substantial concentration of particles in the second region 226. Thus, for example, carbon, germanium, and/or oxygen may be implanted in the first region 212 to induce stress in the second region 226, and in particular, to induce stress in one or more of the source/drain regions 222 and/or the channel region 224 in a controlled fashion. For instance, germanium or oxygen may be implanted in the first region 212 for volumetric expansion thereof and a corresponding compressive stress therein. This, in turn induces tensile stress in one or more portions in the second region 226, for example, inducing a tensile stress in the channel region 224. This may result in improved carrier mobility, for instance, where the device 220 is an NMOS device. Conversely, carbon implantation may be used to contract the first region 212, such as where the device 220 is a PMOS device, causing a tensile stress therein and inducing a compressive stress in the channel 224 of the second region 226.

Referring now to FIGS. 11-14, the present invention may be employed in conjunction with device isolation processing, such as shallow trench isolation (STI) techniques. Although the following exemplary implementations of FIGS. 11-22 are illustrated and described hereinafter in association with STI isolation techniques, it will be appreciated that similar or related processing may be carried out in conjunction with other device isolation techniques, such as field oxide formation (e.g., LOCOS processing) or the like, and that such alternative implementations are contemplated as falling within the scope of the present invention and the appended claims. In this regard, formation (e.g., implantation) of first regions in the substrate may be advantageously performed in association with such isolation steps in order to utilize existing masks therefor, as well as to accommodate or compensate for stress resulting from formation of isolation structures (e.g., such as stress induced in a substrate as a result of shallow trench formation or the like).

Figure 11:
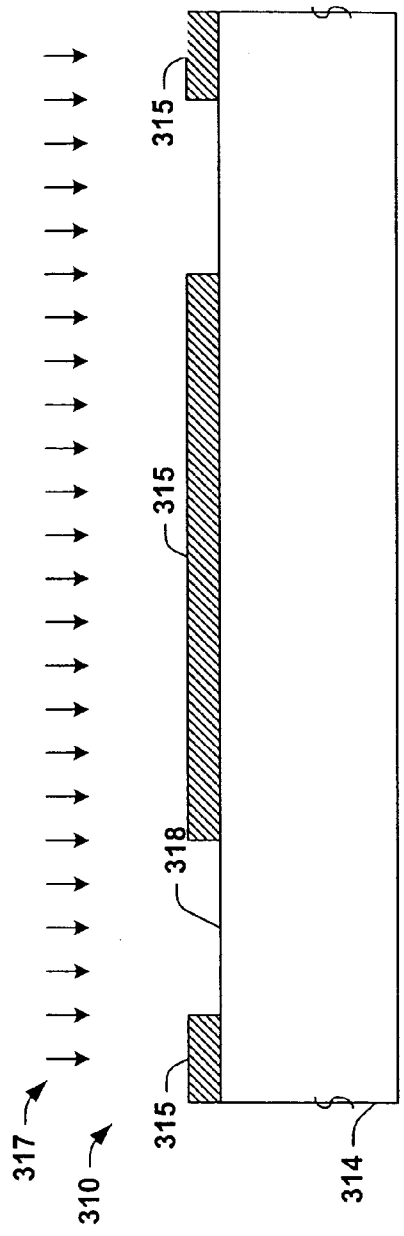
FIGS. 11-14 are side elevation views in section illustrating a portion of another implementation of the invention, wherein one or more regions near isolation trenches in a semiconductor substrate are implanted in order to induce stress in a MOSFET device.
Figure 12:
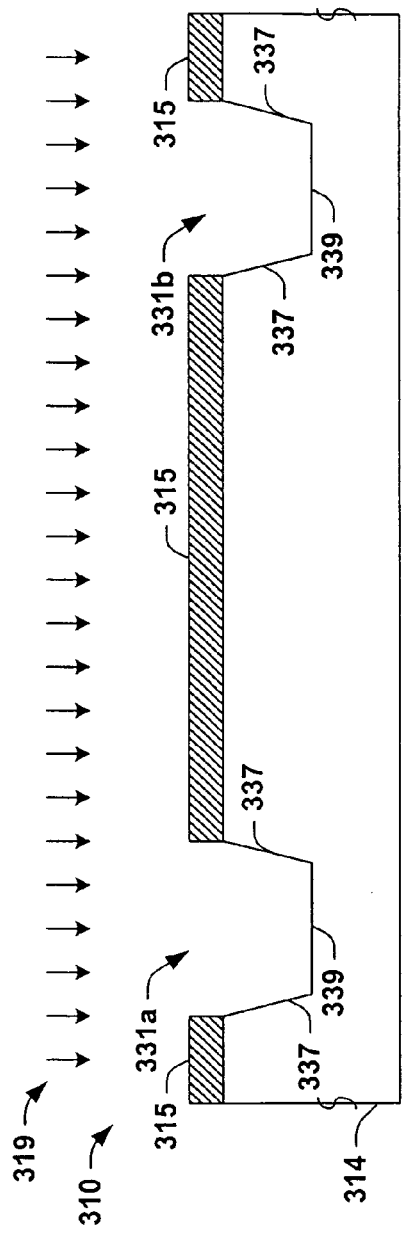
Figure 13:
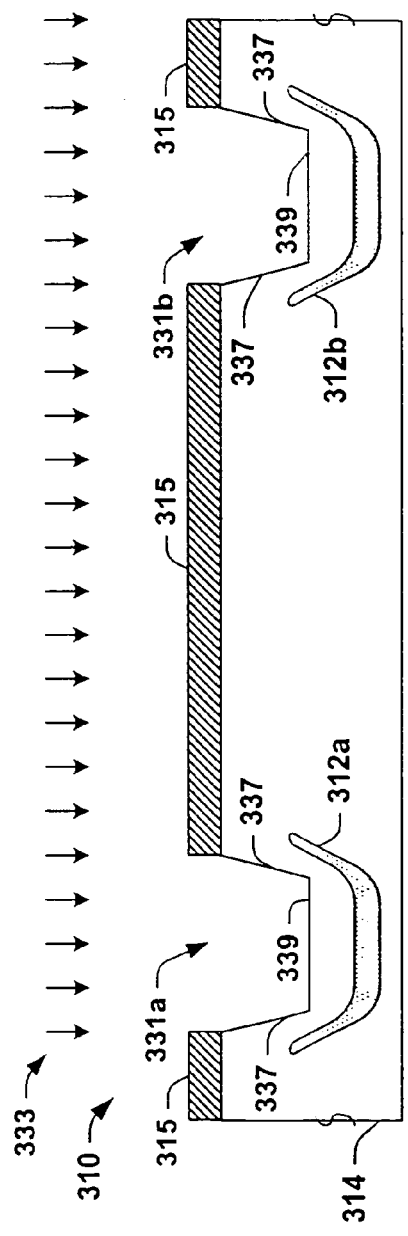
Figure 14:
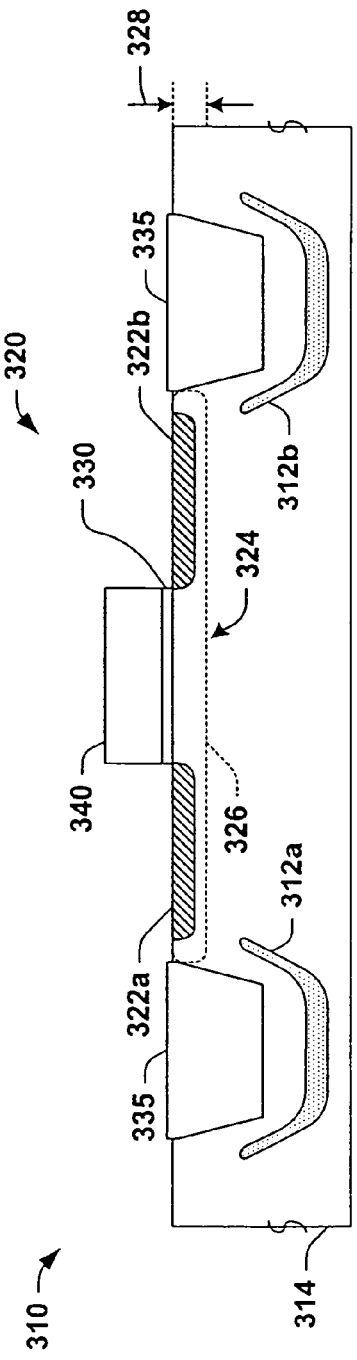

A semiconductor device 310 is illustrated in FIG. 11 having a substrate 314, with an STI mask 315 formed on a top surface 318 of the substrate 314, where the mask 315 has openings over prospective isolation trenches. An etch process 317 is employed to create trenches 331a and 331b in the substrate 314 as illustrated in FIG. 12, wherein the trenches 331 each comprise sidewalls 337 and bottom surfaces 339. Referring also to FIG. 13, the mask 315 is also used with an implantation process 319 to form first regions 312a and 312b generally underlying the trenches 331a and 331b, respectively. Thereafter, a deposition process 333 is employed (e.g., again using the STI mask 315) to fill the trenches 331a and 331b with oxide material to form isolation structures 335, as illustrated in FIG. 14 for isolation with respect to adjacent devices.

A MOSFET transistor device 320 is then formed using appropriate processing steps (not shown), wherein the device 320 comprises first and second source/drain regions 322a and 322b, respectively, which define a channel region 324 therebetween, in a second region 326 extending below the substrate surface to a second region depth 328. The transistor 320 further comprises a gate oxide structure 330 and a polysilicon gate structure 340 overlying the channel region 324, as well as conductive contact structures, and additional overlying insulation and metal layers (not shown). The MOSFET device 320 may be PMOS or NMOS, depending upon the doping of the substrate 314 and that of the source/drain regions 322.

The implantation into the first regions 312 via the process 319 of FIG. 12 creates compressive or tensile stress in the regions 312 so as to induce stress in the second region 326, which in turn can be used to change one or more performance characteristics or other features of the electrical MOSFET device 320. Further in this regard, it is noted that the formation of the STI trenches 331 through the etch process 317, and/or the filling of the trenches 331 with oxide 335 via the process 333 may cause stress (e.g., either compressive or tensile) in the substrate 314, such as in the second region 326, which in turn may impact the electrical performance of the device 320. It will be appreciated that where such trench related stress is favorable to the performance of the device 320, the implantation into the first regions 312 may be employed to advantageously increase such stress. Conversely, where such trench related stress is adverse to the device operation, the implantation of regions 312 may be used to counteract or otherwise to compensate for this stress, by which the performance of the device 320 may be improved.

Figure 15:
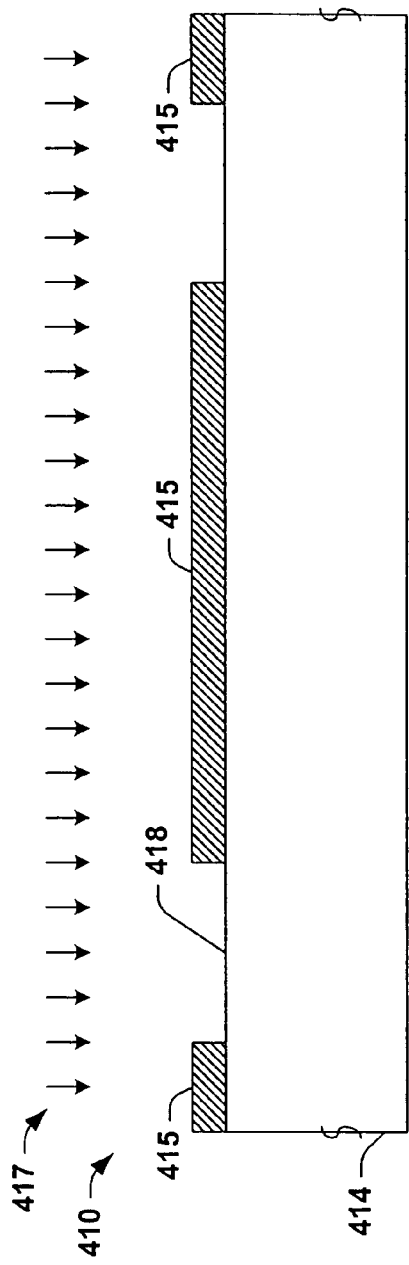
FIGS. 15-18 are side elevation views in section illustrating a portion of another implementation of the invention, wherein a region underlying an electrical device in a semiconductor substrate is implanted in order to induce stress in a MOSFET device.
Figure 16:
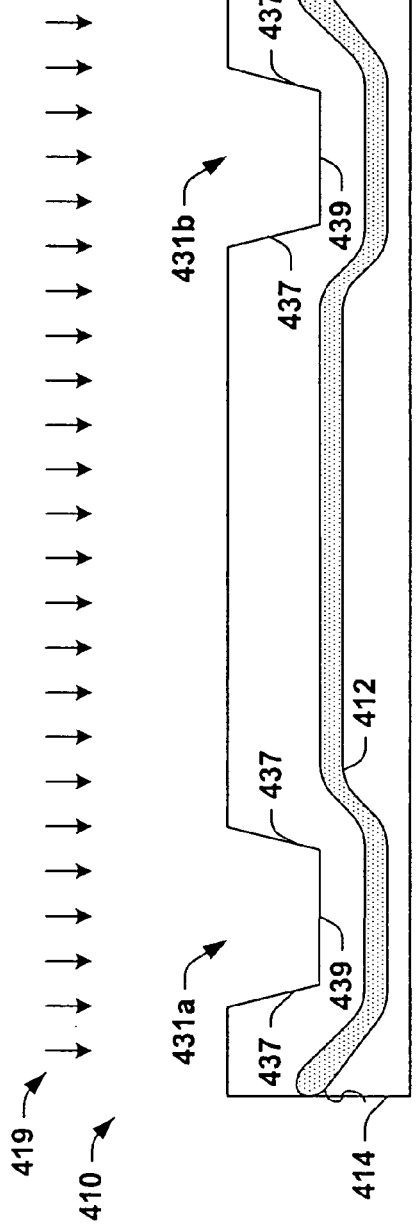
Figure 17:
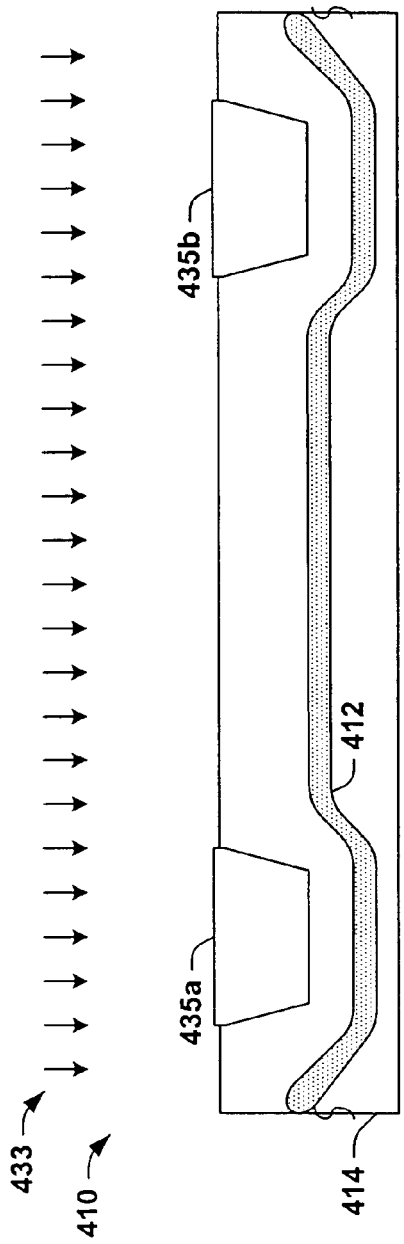
Figure 18:
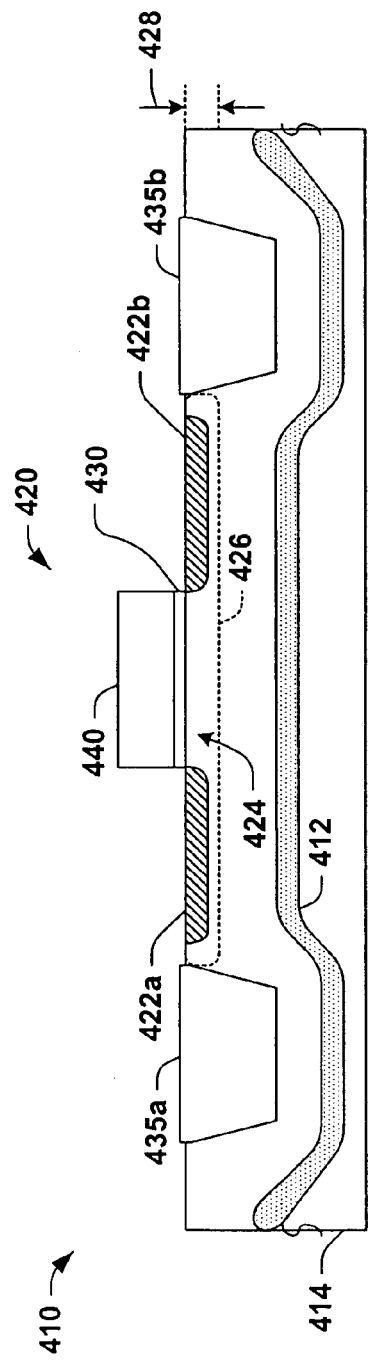
Figure 19:
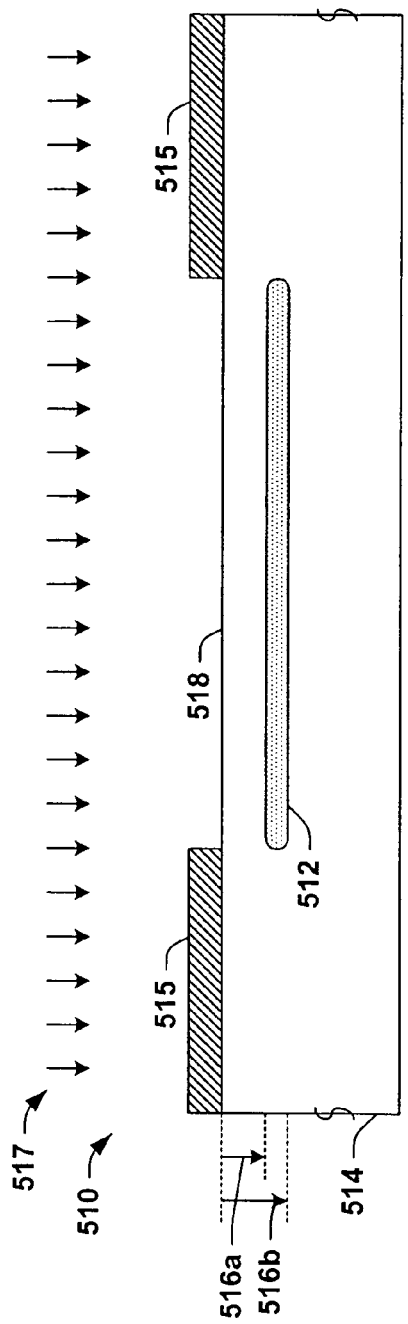

Another implementation of the invention is illustrated and described hereinafter with respect to FIGS. 15-18. Like the device 310 of FIGS. 11-14, the implementation of FIGS. 15-18 involves the isolation process. In FIG. 15, a semiconductor device 410 is illustrated having a substrate 414, with an STI mask 415 formed thereon, wherein the mask 415 includes openings over prospective isolation trenches. An etch process 417 is employed to create trenches 431a and 431b in the substrate 414 as illustrated in FIG. 16, each of which having sidewalls 437 and bottom surfaces 439, whereafter the mask 415 is removed. An implantation process 419 is then used to form a first region 412 underlying the trenches 431a and 431b and the remainder of the illustrated portion of the substrate upper surface 418. Referring also to FIG. 17, a deposition process 433 is then employed to fill the trenches 431a and 431b with oxide material to form isolation structures 435a and 435b. Thereafter, as illustrated in FIG. 18, a MOSFET transistor device 420 is formed, which comprises first and second source/drain regions 422a and 422b, respectively, defining a channel region 424 therebetween, in a second region 426 extending below the substrate surface to a second region depth 428.

The transistor 420 further comprises a gate oxide structure 430 and a polysilicon gate structure 440 overlying the channel region 424, as well as conductive contact structures overlying portions of the source/drain regions 422a and 422b, respectively, and the polysilicon 440. The MOSFET device 420 may be PMOS or NMOS, depending upon the initial doping of the substrate 414 and that of the source/drain regions 422, and it is to be appreciated that the device 410 may include further overlying structures (not shown), such as one or more insulation layers and connection metal layers. The implantation into the first region 412 via the process 419 of FIG. 16 thus creates compressive or tensile stress in the region 412 so as to induce stress in the second region 426, which in turn can be used to change one or more performance characteristics or other features of the electrical MOSFET device 420.

Figure 20:
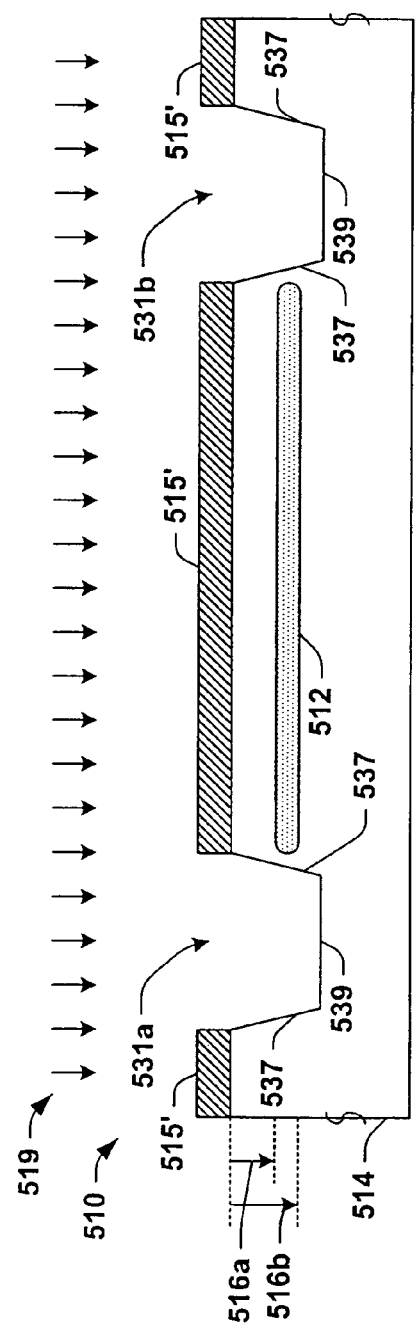

Yet another implementation of the present invention is illustrated and described below with respect to FIGS. 19-22, wherein a semiconductor device 510 comprises a substrate 514, with a first mask 515 formed thereon. The mask 515 includes an opening exposing a prospective transistor device area, through which an implantation process 517 is performed to implant a desired species (e.g., such as carbon, germanium, oxygen, or the like) in a first region 512 underlying the prospective transistor device area between first and second depths 516a and 516b. The mask 515 is then removed, and a second (e.g., STI) mask 515' is formed on the substrate top surface 518, as illustrated in FIG. 20. The second mask 515' is used in conjunction with an etch process 519 to form trenches 531a and 531b having sidewalls 537 and bottom surfaces 539.

Thereafter in FIG. 21, a deposition process 533 is used to deposit isolation material using the openings in the second mask 515' to form isolation structures 535a and 535b, after which the mask 515' is removed. Referring now to FIG. 22, a MOSFET transistor device 520 is then formed by appropriate processing steps (not shown), having first and second source/drain regions 522a and 522b, respectively, defining a channel region 524 therebetween, in a second region 526 extending below the substrate surface to a second region depth 528. The transistor 520 further comprises a gate oxide structure 530 and a polysilicon gate structure 540 overlying the channel region 524, as well as conductive contact structures overlying portions of the source/drain regions 522a and 522b, respectively, the polysilicon gate structure 540. As with the above implementations, the MOSFET device 520 may be PMOS or NMOS, depending upon the specific process steps (not shown) used to form the transistor 520. The implantation into the first region 512 via the process 517 of FIG. 19 thus creates compressive or tensile stress in the first region 512 so as to induce stress in the second region 526, which in turn can be used to change one or more performance characteristics or other features of the electrical MOSFET device 520.

It is noted that although the illustrated implementations of the various aspects of the invention have been discussed above in association with MOSFET transistor devices, other implementations are possible within the scope of the invention, wherein selective or localized implantation of one substrate region is employed so as to induce stress in another region where at least a portion of an electrical device is in the second region. Thus, for example, the invention may be advantageously employed in association with other electrical devices, such as memory cells, bipolar transistors, or the like.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description and the claims, such terms are intended to be inclusive in a manner similar to the term "comprising."

What is claimed is:

1. A semiconductor device, comprising:
first and second regions in a substrate, the first region being implanted with one or more strain inducing dopants so as to selectively induce stress in the second region, where the one or more strain inducing dopants remain substantially localized within respective implantation locations within the first region; and
an electrical device, an entirety of each of a source, drain, and channel of the electrical device being formed in the second region.

2. The semiconductor device of claim 1, wherein the first region is located beneath at least a portion of the second region.

3. The semiconductor device of claim 1, wherein the electrical device comprises at least one of a source/drain region and a channel region formed within the second region.

4. The semiconductor device of claim 1, wherein the first region is implanted with at least one of carbon, germanium, and oxygen so as to induce stress in the second region.

5. The semiconductor device of claim 4, wherein the first region is implanted with carbon so as to create a tensile stress in the first region.

6. The semiconductor device of claim 5, wherein the first region is implanted with one of germanium and oxygen so as to create a compressive stress in the first region.

7. The semiconductor device of claim 6 wherein, the implantation of the first region with one of germanium and oxygen induces a compressive stress in the second region.

8. The semiconductor device of claim 6, wherein the implantation of the first region with one of germanium and oxygen induces a tensile stress in the second region.

9. The semiconductor device of claim 1, wherein the first region is formed under an isolation region associated with the device.

10. The semiconductor device of claim 1, wherein substantially all of the first region is formed under an isolation region associated with the device.

11. The semiconductor device of claim 1, wherein the first region is implanted with at least one of carbon and germanium so as to induce stress in the second region.

12. The semiconductor device of claim 9, wherein the first region is implanted with at least one of carbon and germanium so as to induce stress in the second region.

13. The semiconductor device of claim 10, wherein the first region is implanted with at least one of carbon and germanium so as to induce stress in the second region.

* * * * *